United States Patent [19]

Chan

[11] 4,042,840
[45] Aug. 16, 1977

[54] UNIVERSAL DIFFERENTIAL LINE DRIVER INTEGRATED CIRCUIT

[75] Inventor: Louis Yc. Chan, Sunnyvale, Calif.

[73] Assignee: Signetics Corporation, Sunnyvale, Calif.

[21] Appl. No.: 609,174

[22] Filed: Sept. 2, 1975

[51] Int. Cl.² .......................................... H03K 17/00
[52] U.S. Cl. .................................. 307/270; 307/215; 307/209; 307/317 A
[58] Field of Search ............ 307/209, 215, 270, 317 A

[56] References Cited

U.S. PATENT DOCUMENTS

| | | | |
|---|---|---|---|
| 3,446,989 | 5/1969 | Allen et al. | 307/209 |
| 3,602,733 | 8/1971 | Aoki | 307/209 |
| 3,790,817 | 2/1974 | Dobkin | 307/317 A |

Primary Examiner—Stanley D. Miller, Jr.
Assistant Examiner—B. P. Davis
Attorney, Agent, or Firm—Jerry A. Dinardo; C. Richard Pfeiffer; William H. Dana

[57] ABSTRACT

A universal differential line driver with a single pair of outputs provides by means of a pair of control input lines selectively sourcing, sinking or high impedance conditions on the output pair.

5 Claims, 6 Drawing Figures

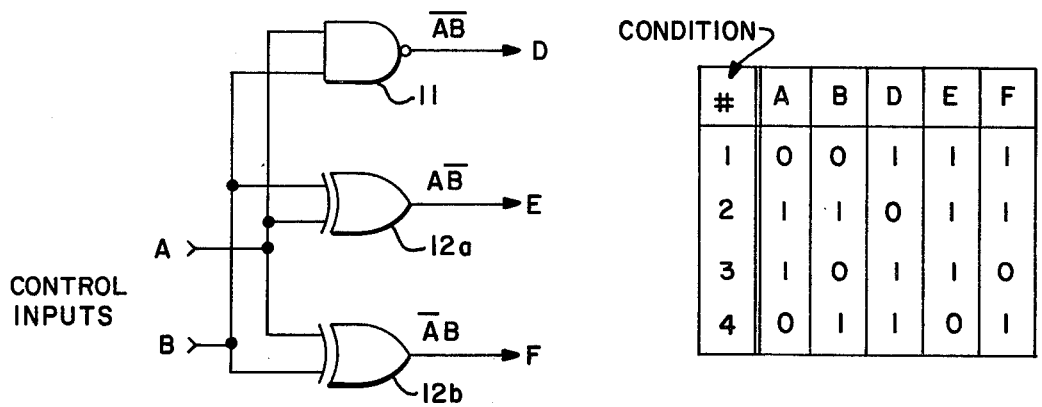
FIG.—1A
FIG.—1B
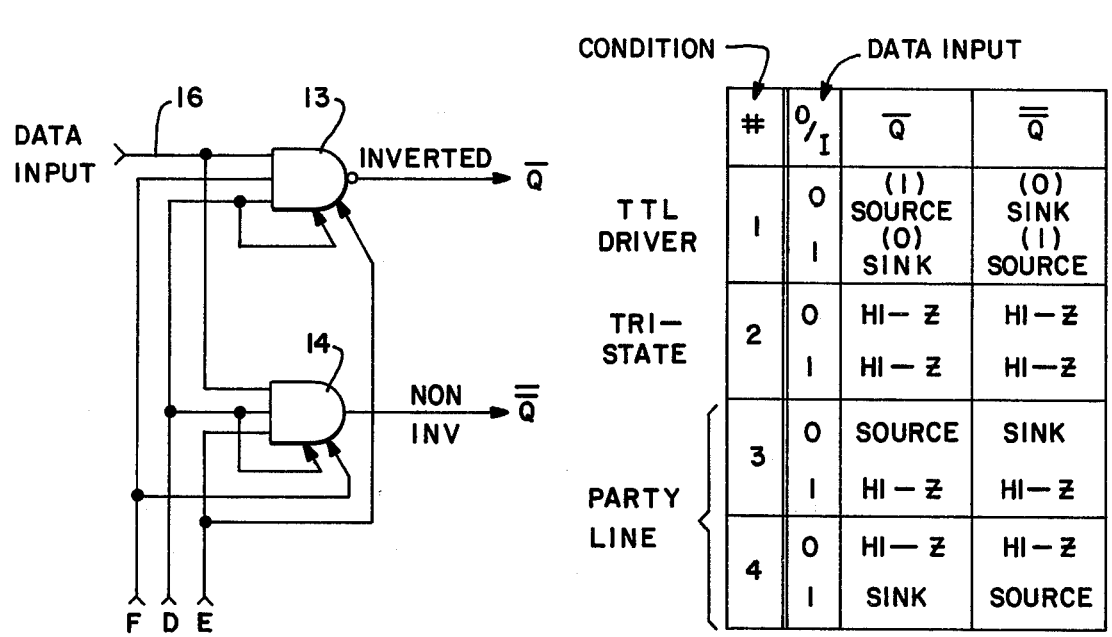
FIG.—2A
FIG.—2B
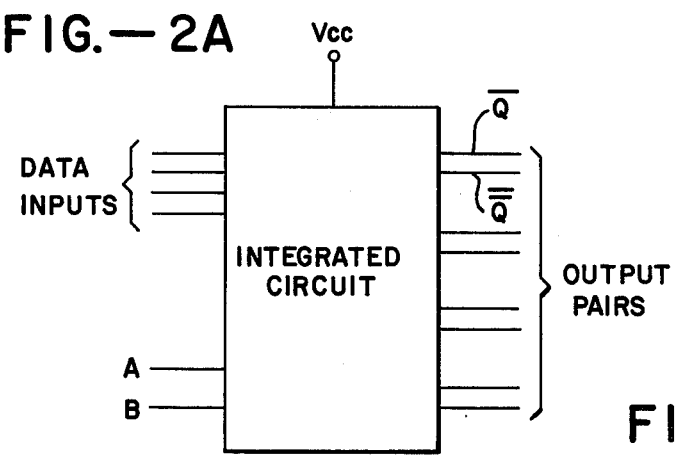
FIG.—3

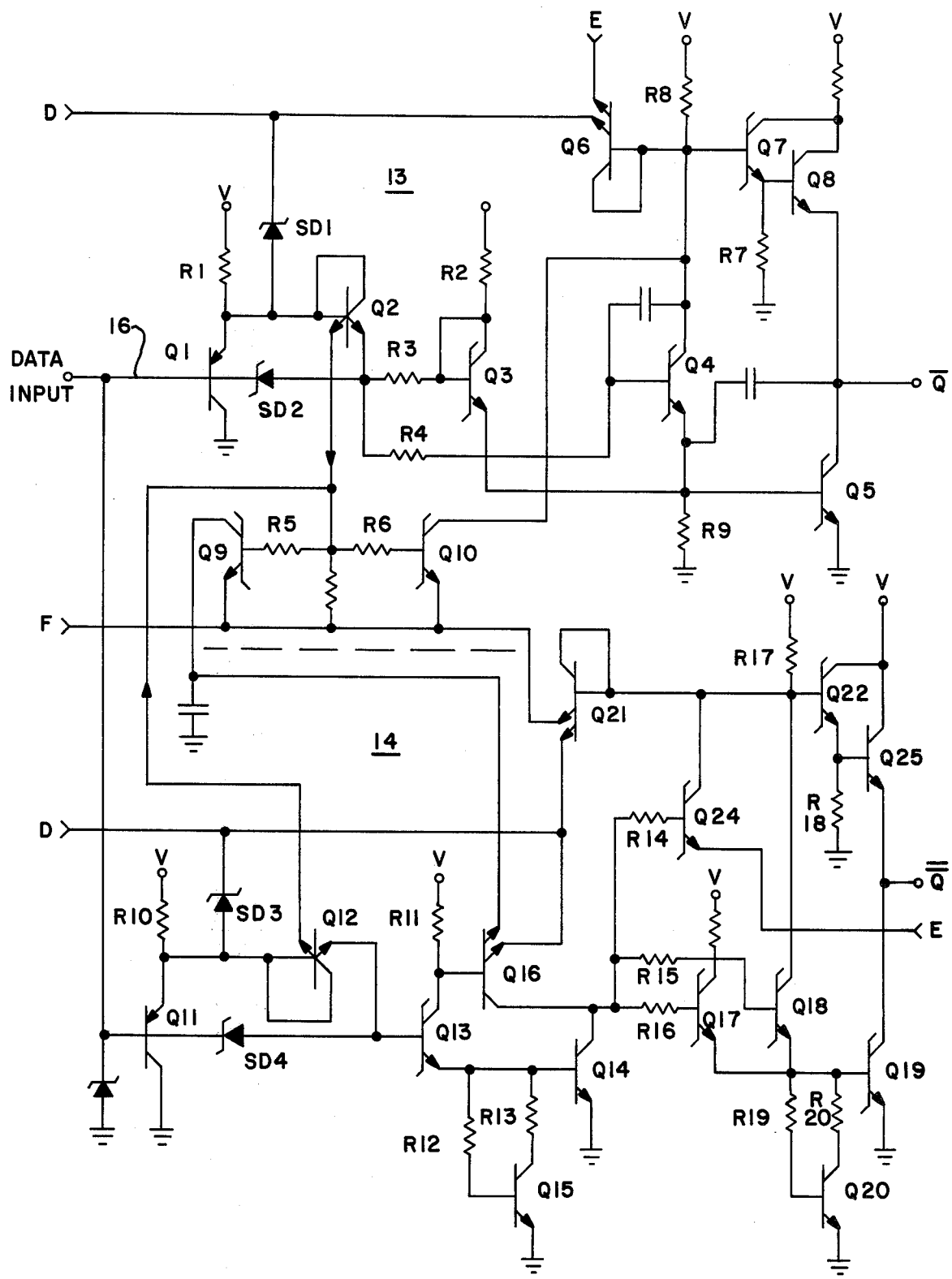
FIG.—4

//
4,042,840

UNIVERSAL DIFFERENTIAL LINE DRIVER INTEGRATED CIRCUIT

BACKGROUND OF THE INVENTION

The present invention is directed to a universal differential line driver integrated circuit and more specifically a line driver circuit which is programmable.

Line driver circuits are well-known in the art. A typical circuit is produced under type no. 9614 by, for example, both the Fairchild Corporation and the Advanced Micro Devices Corporation with the descriptive term differential line drivers. Such circuits have an active pull down and active pull up circuit which are split and brought out to adjacent pins. They drive either differential, single-ended, back matched or terminated transmission lines. Another type of line driver under the type no. 2614 has an active pull up output for high speed and good capacitance drive and is ideal for single ended transmission line driving.

National Semiconductor Corporation under model DM 7830 also manufactures a circuit similar to the type 2614.

Yet another type of driver is illustrated in U.S. Pat. No. 3,602,733 entitled "Three Output Level Logic Circuit" in the name of Edward M. Aoki and assigned to the present assignee. This patent discloses and claims a tri-state or three level logic circuit which has a high output impedance logic level as well as sourcing and sinking levels.

From the foregoing it is apparent that the circuit user depending upon his specific application must choose one of the foregoing types. In some cases the 9614 type can be modified to be single ended but this change is, for example, accomplished by soldering and thus is permanent.

OBJECTS AND SUMMARY OF THE INVENTION

It is, therefore, an object of the present invention to provide a universal differential line driver integrated circuit.

It is a more specific object to provide a line driver integrated circuit as above with a pair of outputs which may be selectively sourcing, sinking or high impedance.

In accordance with the above objects there is provided a universal differential line driver integrated circuit with a pair of selectively sourcing, sinking or high impedance outputs. First logic means are responsive to a binary data input for providing an inverted output. Second logic means are responsive to the binary data input for providing a non-inverted output. Control logic means have three output control lines and are responsive to a control input to selectively place the control lines in one of four different binary logic conditions. The first and second logic means each include current sourcing and sinking means respectively connected to one of the output pair. Means responsive to the different conditions of the control lines and the data input enable only the sinking means of the first logic means and only the sourcing means of the second logic means or vice versa. They also may concurrently disable both the sourcing and sinking means of the first and second logic means to place both of the pair of outputs in a high impedance condition.

BRIEF DESCRIPTION OF THE DRAWINGS

FIG. 1A is a logic diagram showing a control logic portion of the present invention;

FIG. 1B is a truth table showing the operation of FIG. 1A;

FIG. 2A is a logic diagram of another portion of the invention;

FIG. 2B is a truth table showing the operation of FIG. 1A and FIG. 2A;

FIG. 3 is an elevation view of a typical integrated circuit embodying the present invention; and FIG. 4 is a detailed circuit schematic of FIG. 2A.

DETAILED DESCRIPTION OF THE PREFERRED EMBODIMENT

FIG. 1A illustrates the control circuit of the present invention which provides for the four different binary logic conditions listed in the table of FIG. 1B. In response to different binary information on the control inputs A and B the outputs D, E and F are selectively placed in one of four different logic conditions as indicated. The specific circuit includes a NAND gate 11 and exclusive OR gate halves 12a and 12b. These gates produce the D, E and F outputs which are applied to the circuit of FIG. 2A.

This circuit includes the gates 13 and 14 having an inverted output Q and a noninverted output Q. The binary data input is on line 16 and also the control line inputs D, E and F referred to in FIG. 1A are on the lines. The Q and Q lines are, of course, the differential output line pair used as a line driver. The table of FIG. 2B illustrates the four different control conditions and the condition of the two outputs with zero and one data inputs. In condition one the circuit acts as a typical TTL driver with the output pair acting as a source and sink in an inverted or noninverted mode. A source is indicated as being a logical 1 and a sink condition as a logical zero.

In condition 2 this is the high impedance tristate condition where the outputs are forced to high impedance states regardless of the state of the data input. Conditions 3 and 4 are termed party line conditions since depending on the data input the outputs may act as source, sink or alternatively a high impedance. Thus the drivers may be disabled to stay on the bus in the multiplexed system without loading the line. The table of FIG. 2B illustrates the universality of the present circuit.

A typical integrated commercial integrated circuit package is illustrated in FIG. 3 which is a quad differential line driver; that is there are four output pairs. The circuit of FIG. 2A is replicated four times on a common integrated circuit along with FIG. 1A with a single pair of control inputs A, B.

The logic gates illustrated in FIG. 1A are of course well-known in the art. However, the gates 13 and 14 are shown in FIG. 2A as representational only. The detailed circuit schematic of FIG. 2A is illustrated in FIG. 4.

Referring now specifically to FIG. 4, this represents a portion of an integrated circuit with logic units 13 and 14 constituting two of the circuit portions. There is a data input on line 16, Q and Q outputs and in addition the D, E and F inputs from the control logic of FIG. 1A which as discussed above is also part of the same integrated circuit. However, the control logic is not illustrated in detail since it is standard NAND gate and exclusive OR gate components. In general, the Q output terminal is connected to a pull up transistor Q8 and a pull down transistor Q5 which provide for sourcing and sinking when enabled and for a high impedance third state when both are disabled. Similarly, the Q output is connected to a pull up transistor Q25 and pull down transistor Q19 for sourcing and sinking respectively. Throughout the circuit Schottky type transistors are utilized for higher beta. The illustrated capacitors are actually transistors with the collector and emitter tied together.

Referring to the table of FIG. 2B as well as FIG. 1 in condition 1 with a zero data input on line 16, Q1 is ON robbing current off the base of Q2; thus Q2, Q3, Q4 and Q5 are turned off, Q is in a "1" condition sourcing current through R8 and the active pull up Q7 and Q8. In the case of Q output, a zero on line 16 turns on Q11 which turns off Q12, Q13 and Q14. Thus, the collector of Q13 is charged up toward $V_{cc}$ (5V) through R11 turning on Q16, Q17, Q18 and Q19 yielding a zero state at Q. If the data input is a 1 as illustrated by the table, the on and off conditions are reversed. This is the TTL driver operating mode.

In condition 2, the outputs are forced to high impedance state regardless of the state of the data input.

Finally in the party line conditions of conditions 3 and 4 as illustrated in FIG. 2B, the same source and sink conditions of condition 1 are duplicated except the lower output and the pull up transistors are disabled respectively or vice versa for condition 4. This is equivalent to having the active pull-down and active pull-up circuits split and allows multiplex operation (wired AND) at the driving end.

First referring in detail to the tri-state condition 2, all of the output transistors must be in an off or high impedance condition; viz, Q5, Q8, Q19 and Q25. This is irrespective of the data input. In condition 2 referring to the table of FIG. 1B, the D output is low or zero and E and F are "1"; Q9, Q10 and Q24 are off. In logic unit 13 since D is low, Q6 and SD1 are effectively on taking current away from the bases of Q7 and Q2 respectively. Thus, the input and output transistors are disabled, in other words, Q is in a high impedance state.

In the case of the logic portion 14 with D in a zero state, SD3, Q16 and Q21 are on robbing current from the bases of Q12, Q17, Q18 and Q22 respectively to put Q14, Q19 and Q25 in their off state; that is, Q is in high impedance state.

For condition 3 illustrated in FIGS. 1B and 2B, when the data input is zero, Q1 is on taking current away from the base of Q2. Thus, Q2, Q9, Q10, Q3, Q4 and Q5 are off and since D and E are 1 Q6 is off. The collectors of Q10 and Q4 will rise toward $V_{cc}$(5V) yielding a voltage level of approximately $V_{cc} - 2V_{be}$ at Q. Thus, current can be sourced through the Darlington pair of Q7 and Q8. With respect to logic unit 14, Q11 is on, SD3 is off causing Q12, Q13 and Q14 to be off. The collector of Q14 will charge up towards $V_{cc} - V_{bc}$ through R11 turning Q17, Q18 and thus Q19 on; at the same time the active pull-up circuits (R17, Q22 and Q25) are disabled since Q21 is on with F sitting at a zero level. Thus the Q output sinks current with its active pull-up transistors disabled. This allows multiplex operation (wired AND) at the driving end and the output is equivalent to having an open (bare) collector structure.

When the data input is 1, the base emitter junction of Q1 is reversed biased with current flowing into the base of Q9 and Q10 forcing them into saturation since F is zero. Referring to logic unit 13, since the base of Q9 and Q10 take up all of the current from one emitter of Q2, there is not enough base drive to turn Q3 and Q4 on. Thus, Q5 is off. The active pull-up transistors Q7 and Q8 are disabled by Q10 being saturated. Thus Q is at a high impedance state. In logic unit 14, Q21 is on turning off Q22 and Q25. Since Q9 is on, the collector of Q14 is sitting at $V_{OS}$(Q16) + $V_{SAT}$(Q9) + zero (F), which, in turn, takes current from the base of Q17 and Q18. Thus, Q19 is off. With both the pull-up and the lower output transistors cut off the Q output is in a high impedance state.

For condition 4, when the input is zero, both outputs are in a high impedance state. Q2, Q3, Q4 and Q5 are off, E is low disabling Q7 and Q8 through Q6; Q24 is on robbing base drive away from the bases of Q17, Q18, and placing them in an off condition. Q19 is off as well. With Q24 being on (since E is zero), its collector takes current away from the base of Q22, thus disabling the active pull-up circuit, and Q is in a high impedance state.

When the data input is one, in logic unit 13 the base emitter junction of Q1 is reversed biased, current flows into the bases of Q3 and Q4, and Q5 is on; since E is low the active pull-ups Q7 and Q8 are disabled. The collector of Q5 is analogous to an open collector. For logic unit 14, when the data input is one, Q13 and Q14 are on, turning off Q24, Q17, Q18 and Q19; thus the collectors of Q24 and Q18 are charged towards $V_{cc}$(5V) enabling Q22 and Q25. Thus Q can only source current and can be connected in a wired AND.

Thus, in summary the present circuit provides a universal differential line driver with tri-state outputs. The various operating modes of the driver are controlled by two control lines where the driver can be made to operate in a single ended or multiplexed configuration. The tri-state capability allows disabled drivers to stay on a buss in a multiplex system without loading the line. The differential feature when used with a suitable line receiver eliminates troublesome ground loops and common mode noise associated with single wire transmission.

What is claimed is:

1. In a line driver circuit of the type having a single polarity binary signal input and having two binary signal outputs capable of selectively assuming one of four conditions, said circuit comprising:
   a. first logic means responsive to said binary signal input for providing an inverted binary signal output at a first output terminal;
   b. second logic means responsive to said binary signal input for providing a non-inverted binary signal output at a second output terminal electrically isolated from said first output terminal, each of said logic means including current sourcing and sinking means at its respective output terminal; and
   c. control logic means connected to said first and second logic means for selectively operating on said current sourcing and sinking means so that they assume one of the following alternative conditions:
   1. a first condition in which the current sourcing and current sinking means of both said first and second logic means are disabled whereby each binary signal output exhibits a high impedance state;
   2. a second condition in which both of said current sourcing and current sinking means are enabled whereby each signal output provides, respectively, non-inverted and inverted single polarity replicas of the binary signal input;
3. a third condition in which the current sourcing means of said first logic means and the current sinking means of said second logic means are enabled while the respective current sinking and current sourcing means thereof are disabled; or
4. a fourth condition which is the inverse of said third condition;

d. said third and fourth conditions resulting in an operational mode in which both binary signal outputs in combination provide a two polarity differential output.

2. The invention according to claim 1 wherein said current sourcing means and said current sinking means comprise active pull-up and pull-down circuits respectively.

3. The invention according to claim 2 wherein said pull-up and pull-down circuits comprise bipolar transistors.

4. The invention according to claim 3, wherein said line driver circuit is embodied in integrated circuit form.

5. The invention according to claim 4 wherein said line driver circuit includes Schottky type transistors.

* * * * *